US008569858B2

(12) United States Patent
Winstead et al.

(10) Patent No.: US 8,569,858 B2
(45) Date of Patent: Oct. 29, 2013

(54) SEMICONDUCTOR DEVICE INCLUDING AN ACTIVE REGION AND TWO LAYERS HAVING DIFFERENT STRESS CHARACTERISTICS

(75) Inventors: Brian A. Winstead, Austin, TX (US); Vance H. Adams, Austin, TX (US); Paul A. Grudowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1346 days.

(21) Appl. No.: 11/613,326

(22) Filed: Dec. 20, 2006

(65) Prior Publication Data
US 2008/0150072 A1   Jun. 26, 2008

(51) Int. Cl.
H01L 29/78        (2006.01)
H01L 21/8234      (2006.01)
H01L 27/088       (2006.01)

(52) U.S. Cl.
CPC ....... H01L 21/823412 (2013.01); H01L 27/088 (2013.01); H01L 29/7842 (2013.01)
USPC ............ 257/506; 257/E21.633; 257/E21.703; 257/E27.112

(58) Field of Classification Search
USPC ............ 257/506, E21.633, E21.703, E27.112
See application file for complete search history.

(56) References Cited

U.S. PATENT DOCUMENTS

| 4,569,698 | A | 2/1986 | Feist |
| 4,667,395 | A | 5/1987 | Ahlgren et al. |
| 5,200,351 | A | 4/1993 | Hadjizadeh-Amini |
| 5,283,202 | A | 2/1994 | Pike, Jr. et al. |
| 5,849,616 | A | 12/1998 | Ogoh |
| 5,970,330 | A | 10/1999 | Buynoski |
| 6,506,642 | B1 | 1/2003 | Luning et al. |
| 6,573,172 | B1 | 6/2003 | En et al. |
| 6,686,286 | B2 | 2/2004 | Yoon |
| 6,815,279 | B2 | 11/2004 | Yagishita |
| 6,864,135 | B2 | 3/2005 | Grudowski et al. |

(Continued)

FOREIGN PATENT DOCUMENTS

| EP | 1487007 A2 | 12/2004 |
| KR | 100567022 B1 | 4/2006 |

(Continued)

OTHER PUBLICATIONS

H.S. Yang, et al., "Dual Stress Liner for High Performance sub-45nm Gate Length SOI CMOS Manufacturing", IEEE, 2004, pp. 28.8.1-28.8.3.

(Continued)

*Primary Examiner* — Colleen Matthews

(57) ABSTRACT

An integrated circuit includes a device including an active region of the device, where the active region of the device includes a channel region having a transverse and a lateral direction. The device further includes an isolation region adjacent to the active region in a traverse direction from the active region, where the isolation region includes a first region located in a transverse direction to the channel region. The isolation region further includes a second region located in a lateral direction from the first region. The first region of the isolation region is under a stress of a first type and the second region of the isolative region is one of under a lesser stress of the first type or of under a stress of a second type being opposite of the first type.

22 Claims, 7 Drawing Sheets

(56) References Cited

U.S. PATENT DOCUMENTS

| | | |
|---|---|---|
| 6,870,179 B2 | 3/2005 | Shaheed et al. |
| 6,872,617 B2 | 3/2005 | Sashida |
| 6,876,081 B2 | 4/2005 | Chow |
| 6,887,751 B2 * | 5/2005 | Chidambarrao et al. ..... 438/216 |
| 6,891,192 B2 | 5/2005 | Chen et al. |
| 6,902,971 B2 | 6/2005 | Grudowski |
| 6,933,565 B2 | 8/2005 | Matsumoto et al. |
| 6,982,465 B2 | 1/2006 | Kumagai et al. |
| 7,084,061 B2 | 8/2006 | Sun et al. |
| 7,101,742 B2 | 9/2006 | Ko et al. |
| 7,105,394 B2 | 9/2006 | Hachimine et al. |
| 7,109,568 B2 | 9/2006 | Kumagai et al. |
| 7,138,310 B2 | 11/2006 | Currie et al. |
| 7,276,769 B2 | 10/2007 | Yamada et al. |
| 7,279,746 B2 | 10/2007 | Doris et al. |
| 7,297,584 B2 | 11/2007 | Park et al. |
| 7,316,960 B2 | 1/2008 | Ting |
| 7,374,987 B2 | 5/2008 | Chidambarrao et al. |
| 7,420,202 B2 | 9/2008 | Adams et al. |
| 7,423,330 B2 | 9/2008 | Satoh |
| 7,714,318 B2 | 5/2010 | Adams et al. |
| 2003/0194822 A1 | 10/2003 | Chen et al. |
| 2005/0040461 A1 | 2/2005 | Ono et al. |
| 2005/0227425 A1 | 10/2005 | Henley |
| 2005/0285137 A1 * | 12/2005 | Satoh ............................ 257/178 |
| 2006/0113568 A1 | 6/2006 | Chan et al. |
| 2006/0121688 A1 | 6/2006 | Ko et al. |
| 2006/0138557 A1 | 6/2006 | Huang et al. |
| 2006/0249794 A1 | 11/2006 | Teh et al. |
| 2006/0281240 A1 | 12/2006 | Grudowski et al. |
| 2007/0012960 A1 | 1/2007 | Knoefler et al. |
| 2007/0090455 A1 | 4/2007 | Lim et al. |
| 2007/0132031 A1 | 6/2007 | Shroff et al. |
| 2007/0246776 A1 * | 10/2007 | Moroz et al. .................. 257/349 |

FOREIGN PATENT DOCUMENTS

| | | |
|---|---|---|
| KR | 20060034686 A | 4/2006 |
| KR | 20070011408 A | 1/2007 |
| WO | 2004049406 A1 | 6/2004 |
| WO | 2004114400 A1 | 12/2004 |
| WO | 2005098962 A1 | 10/2005 |

OTHER PUBLICATIONS

S. Pidin, et al., "A Novel Strain Enhanced CMOS Architecture Using Selectively Deposited High Tensile and High Compressive Silicon Nitride Films", IEEE 2004, pp. 9.2.1-9.2.4.

U.S. Appl. No. 11/269,303, filed Nov. 8, 2005.

Grudowski, P. et al. "1-D and 2-D Geometry Effects in Uniaxially-Strained Dual Etch Stop Layer Stressor Integrations"; 2006 Symposium on VLSI Technology, Digest of Technical Papers; 2006; pp. 62-63; IEEE ISBN 1-4244-0005-8.

Pidin, S. et al. "A Novel Strain Enhanced CMOS Architecture Using Selectively Deposited High Tensile and High Compressive Silicon Nitride Films"; 2004 Electron Devices Meeting, IEDM Technical Digest International; Dec. 13-15, 2004; pp. 213-216; IEEE ISBN 0-7803-8684-1.

Shimizu, A. et al. "Local Mechanical-Stress Control (LMC): A New Technique for CMOS-Performance Enhancement"; 2001 Electron Devices Meeting, IEDM Technical Digest International; Dec. 2-5, 2001; pp. 19.4.1-19.4.4; IEEE ISBN 0-7803-7050-3.

Yang, H.S. et al. "Dual Stress Liner for High Performance sub-45nm Gate Length SOI CMOS Manufacturing"; 2004 Electron Devices Meeting, IEDM Technical Digest International; Dec. 13-15, 2004; pp. 1075-1077; IEEE ISBN 0-7803-8684-1.

EPC Application No. 06816682.6; Extended Search Report mailed Oct. 7, 2009, 9 pages.

Notice of Allowance mailed Apr. 29, 2008 for U.S. Appl. No. 12/180,818, 7 pages.

Notice of Allowance mailed Apr. 9, 2009 for U.S. Appl. No. 12/180,818, 7 pages.

Notice of Allowance mailed Oct. 7, 2009 for U.S. Appl. No. 12/180,818, 6 pages.

Notice of Allowance mailed Jan. 19, 2010 for U.S. Appl. No. 12/180,818, 6 pages.

* cited by examiner

SEMICONDUCTOR DEVICE INCLUDING AN ACTIVE REGION AND TWO LAYERS HAVING DIFFERENT STRESS CHARACTERISTICS

RELATED APPLICATION

A related, copending application is entitled "ELECTRONIC DEVICE INCLUDING A TRANSISTOR STRUCTURE HAVING AN ACTIVE REGION ADJACENT TO A STRESSOR LAYER AND A PROCESS FOR FORMING THE ELECTRONIC DEVICE," by Vance H. Adams, Paul A. Grudowski, Venkat Kolagunta, and Brian A. Winstead, application Ser. No. 11/269,303, assigned to Freescale Semiconductor, Inc., and was filed on Nov. 8, 2005.

BACKGROUND OF THE INVENTION

1. Field of the Invention

This invention relates in general to integrated circuits and more specifically to an integrated circuit with tensile and compressive layer regions.

2. Description of the Related Art

Many integrated circuits have semiconductor devices having active regions, including channel regions. Carrier mobility within the channel regions may determine the performance of such semiconductor devices. Typically, the carrier mobility within the channel regions is a function of the type of material being used to form the channel regions. Many materials used to form the channel regions respond to compressive and tensile stresses/strains. Typically, a stress layer formed using an etch-stop layer has been used to generate either compressive or tensile stress on the channel regions. Such etch-stop layers, however, have several problems. For example, conventional dual etch-stop layers may degrade performance of certain types of semiconductor devices.

Thus, there is a need for an integrated circuit with tensile and compressive layer regions arranged in a manner to optimize performance of certain semiconductor devices.

BRIEF DESCRIPTION OF THE DRAWINGS

The present invention may be better understood, and its numerous objects, features, and advantages made apparent to those skilled in the art by referencing the accompanying drawings.

Figure 1:
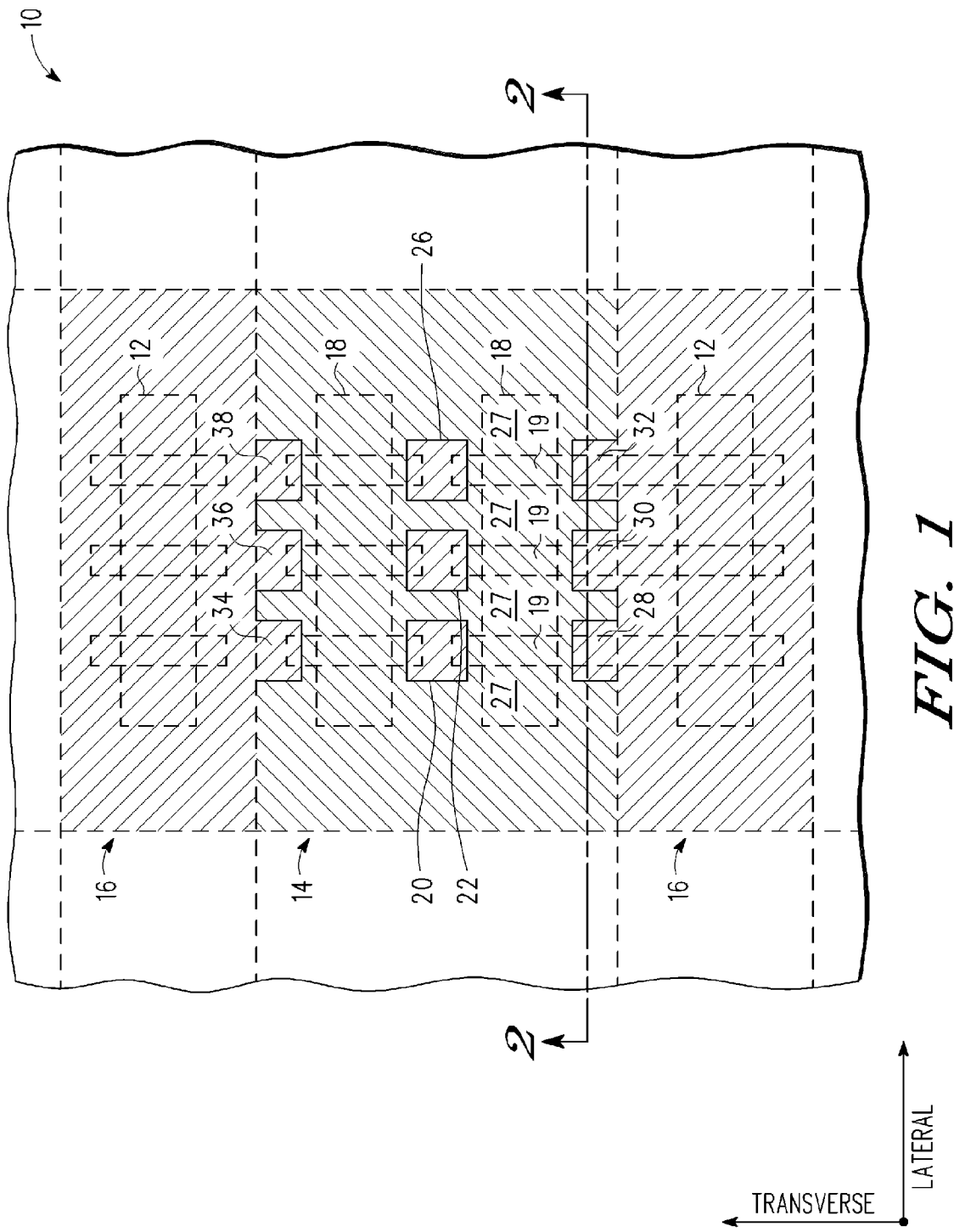
FIG. 1 is a view of an exemplary integrated circuit with a tensile region and a compressive region, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, an integrated circuit includes a device including an active region of the device, where the active region of the device includes a channel region having a transverse and a lateral direction. The lateral direction is the direction of electric current flow through the channel region. The transverse direction is the direction within the active region perpendicular to the direction of electric current flow in the channel region. The device further includes an isolation region adjacent to the active region in a traverse direction from the active region, where the isolation region includes a first region located in a transverse direction to the channel region. The isolation region further includes a second region located in a lateral direction from the first region and located in a transverse direction from a portion of the active region, wherein the portion of the active region is located in a lateral direction from the channel region. The first region of the isolation region is under a stress of a first type, wherein the second region of the isolative region is one of under a lesser stress of the first type or of under a stress of a second type being opposite of the first type.

In another aspect, an integrated circuit includes a device including an active region of the device, where the active region of the device includes a channel region having a transverse and a lateral direction. The device further includes an isolation region adjacent to the active region. The device further includes a first layer of a material, where the first layer includes a portion located over a first region of the isolative region, the first region is located in a transverse direction from the channel region of the device, and the first layer of material is not located over the active region. The active device further includes a second layer of material, the second layer including a portion located over a second region of the isolative region, the second region is located in a lateral direction from the first region of the isolative region and is located in a transverse direction from a portion of the active region, wherein the portion of the active region is located in a lateral direction from the channel region, wherein the second layer is not located over the first region of the isolative region, where the first layer of material is not located over the second region of the isolation region.

In yet another aspect, an integrated circuit includes a device including an active region of the device, where the active region of the device includes a channel region having a transverse and a lateral direction. The device further includes an isolation region adjacent to the active region in a traverse direction from the active region, where the isolation region includes a first region located in a transverse direction to the channel region. The isolation region further includes a second region located in a lateral direction from the first region and located in a transverse direction from a portion of the active region, wherein the portion of the active region is located in a lateral direction from the channel region. The device further includes a first layer located over the first region of the isolative region and the second region of the isolative region, the first layer is not located over the active region of the device, where the first layer is separated from the first region by a first vertical distance, the first layer is separated from the second region by a second vertical distance, the second vertical distance being a greater distance than the first vertical distance.

FIG. 1 is a view of an exemplary integrated circuit with a tensile region and a compressive region, consistent with one embodiment of the invention. A portion 10 of the integrated circuit may include semiconductor devices having different conductivity. For example, portion 10 of the integrated circuit may include n-type devices in active region 12 and p-type devices in active regions 18. Further, various compressive and tensile layers may be used to achieve a desired level of stress/strain in a channel region of these semiconductor devices. For example, p-type devices may have a layer 14 of a material over at least active regions 18. Layer 14 may be formed using a compressive etch-stop material. N-type devices may have a layer 16 of a material over at least active regions 12 corresponding to the n-type devices. Layer 16 may be formed using a tensile etch-stop material. Layers 14 and 16 can include an oxide, a nitride, an oxynitride, or a combination thereof and can be grown or deposited. The magnitude of the stress in the channels of devices located in active regions 12 and 18 is a function of the thickness and inherent stress of the overlying film and the thickness and inherent stresses of films overlying nearby active and isolation regions. One or more process parameters such as pressure, temperature, gas ratio, power density, frequency, irradiation, ion implantation, or any combination thereof, can be used to affect the stress in a film. In one embodiment, a plasma-enhanced chemical vapor deposition ("PECVD") can be used to deposit a tensile film or a compressive film. In another embodiment, the process parameter(s) can increase or decrease the magnitude of the stress without changing type of stress (i.e., tensile or compressive). Although not described specifically, various semiconductor manufacturing techniques can be used to achieve the various layers described with reference to FIG. 1. An isolation region (underlying layers 14 and 16) contains portions 20, 22, 26, 28, 30, 32, 34, 36, and 38, which in the illustrated embodiment are overlaid with layer 16. In another embodiment, some of the portions 20, 22, 26, 28, 30, 32, 34, 36, and 38 may be overlaid with layer 16 and others may be overlaid with layer 14.

A channel 19 may be formed as part of p-type devices in active region 18. The channel may have a channel length and a channel width. The term "channel length" is intended to mean a dimension of a channel region of a transistor structure, wherein the dimension represents a minimum distance between a source region and a drain region or between source/drain regions of the transistor structure. From a top view, the channel length is typically in a direction that is substantially perpendicular to channel-source region interface, channel-drain region interface, channel-source/drain region interface, or the like. The term "channel width" is intended to mean a dimension of a channel region of a transistor structure, wherein the dimension is measured in a direction substantially perpendicular to the channel length. From a top view, the channel width typically extends from one channel region-field isolation region interface to an opposite channel region-field isolation region interface.

Figure 2:
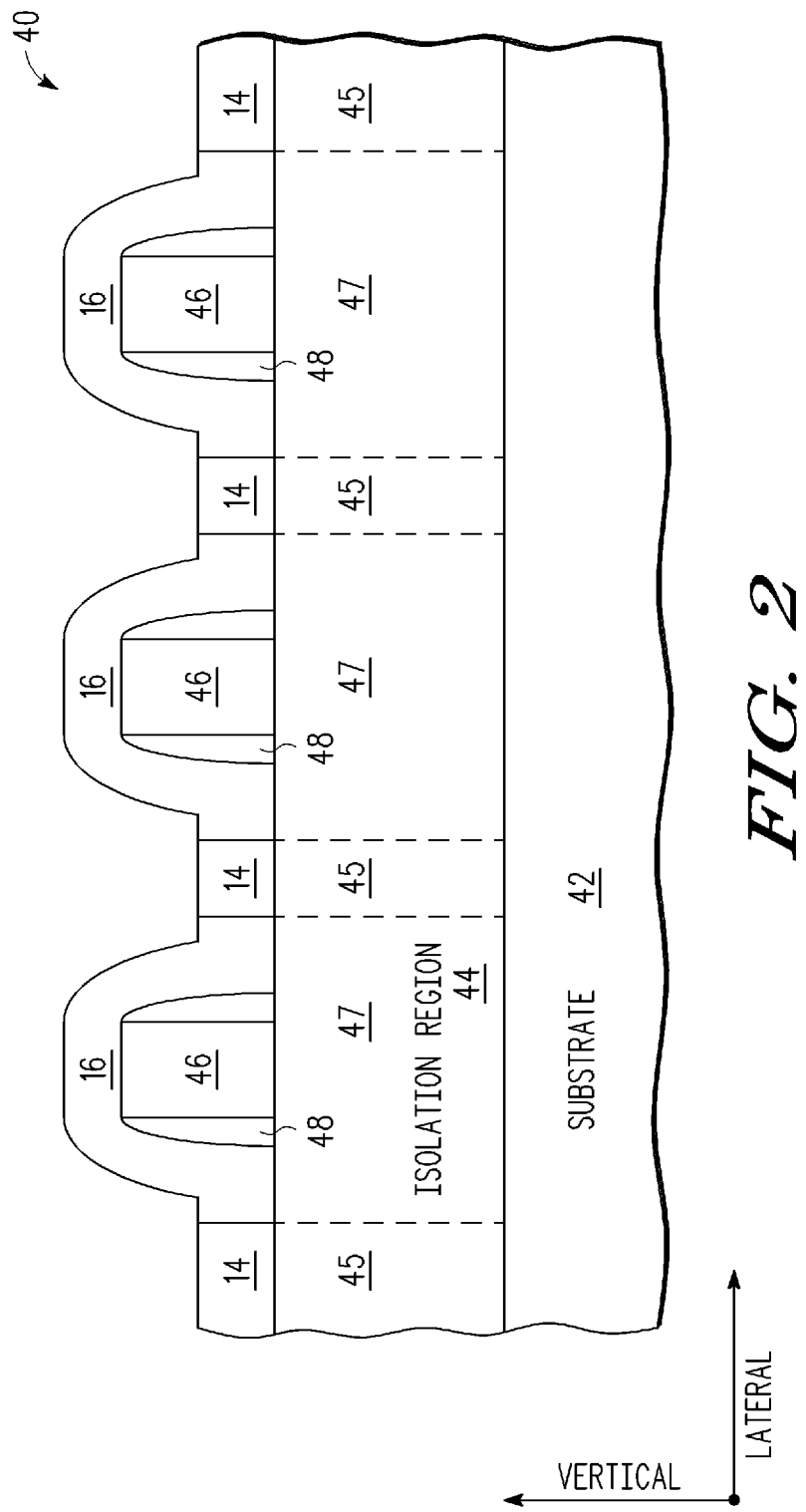
FIG. 2 is another view of the exemplary integrated circuit of FIG. 1, consistent with one embodiment of the invention.

FIG. 2 is a cross-section view 40 of the exemplary integrated circuit of FIG. 1, consistent with one embodiment of the invention. In particular, for illustration purposes, FIG. 2 shows a cross-section view 40 of a portion 10 of an integrated circuit, along direction 2-2, as labeled in FIG. 1. As shown in FIG. 2, the portion of integrated circuit 10 may include a substrate 42 and an isolation region 44 formed over substrate 42. Substrate 42 can include a monocrystalline semiconductor wafer, a semiconductor-on-insulator wafer, a flat panel display (e.g., a silicon layer over a glass plate), or other substrate conventionally used to form semiconductor or electronic devices. Moreover, FIG. 2 shows a cross-section view of gate region 46 corresponding to semiconductor devices formed as part of the integrated circuit. Further, each gate region may have at least one sidewall spacer 48. FIG. 2 further shows a cross-section view of layer 14 and layer 16. As shown in FIG. 2 with respect to a direction legend indicating a lateral direction and a vertical direction, gate region 46 extends both in a lateral direction and a vertical direction. Isolation region 44 may include a first region 47 and a second region 45. First region 47 may be overlaid with a tensile material, such that it may provide a tensile stress in a transverse direction in the channel region transverse to region 47. Second region 45 may be overlaid with a compressive material, such that it may provide a compressive stress in a lateral direction in the channel region transverse to region 47. As a result of the configuration shown in FIGS. 1 and 2, the carrier mobility enhancement due to lateral and transverse channel stress for p-type devices in active region 18 may be increased in a dual etch-stop layer integration.

Figure 3:
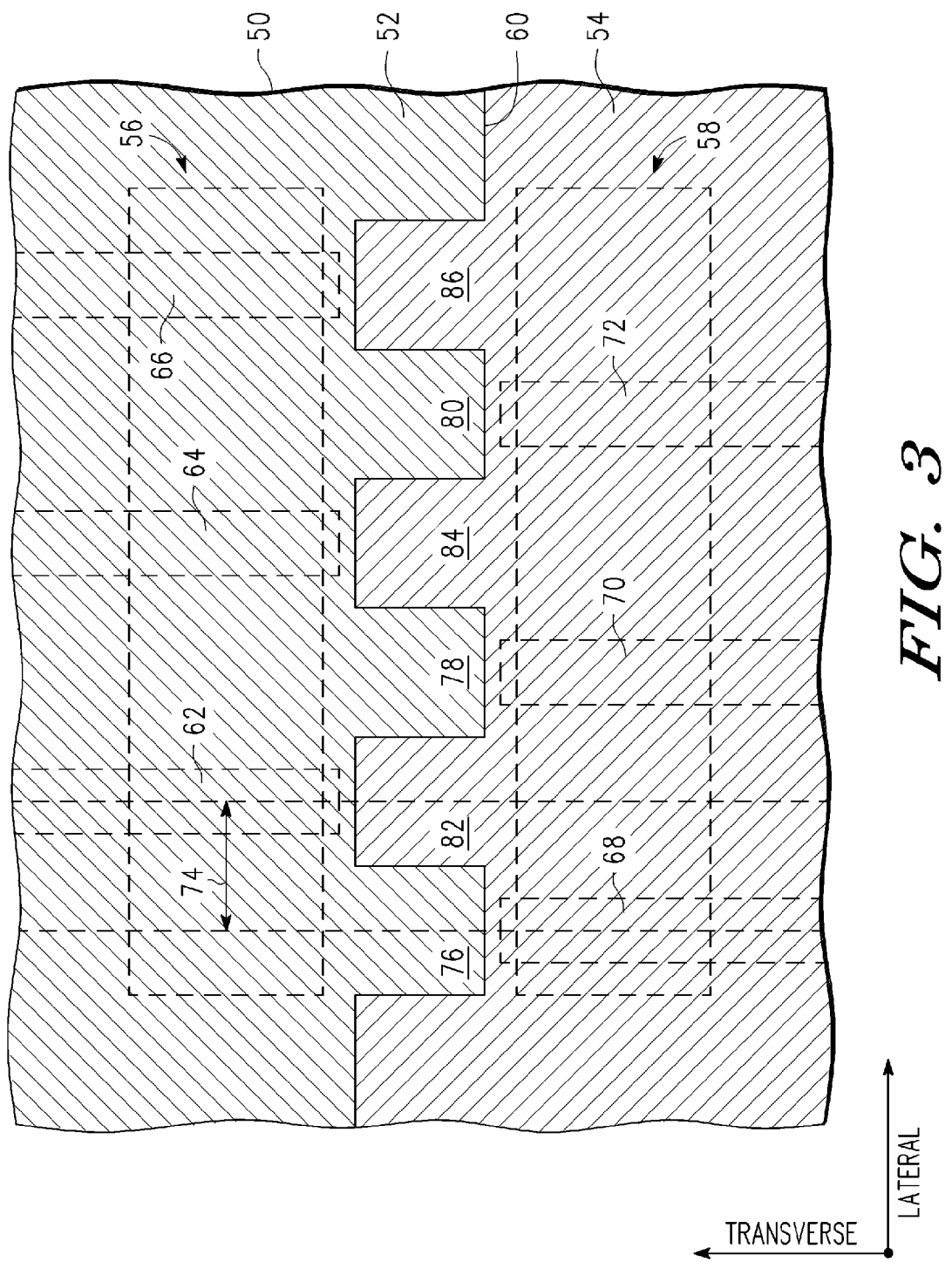
FIG. 3 is a view of a portion of an exemplary integrated circuit with a tensile region and a compressive region where the tensile region and the compressive region are offset with respect to the channel region in a lateral direction, consistent with one embodiment of the invention.

FIG. 3 is a view of a portion 50 of an exemplary integrated circuit with a tensile region and a compressive region where the tensile region and the compressive region are offset with respect to the channel region in a lateral direction, consistent with one embodiment of the invention. P-type devices 56 (also, referred to as a bank of p-type devices) and n-type devices 58 (also, referred to as a bank of n-type devices) may be formed as part of the exemplary integrated circuit. P-type devices 56 may have channel regions (62, 64, and 66) formed as part of these devices. Portion 50 of the integrated circuit may include a layer 52, which may be compressive like layer 14 of FIG. 1. Portion 50 may further include a layer 54, which may be tensile like layer 16 of FIG. 1. As shown in FIG. 3, p-type devices 56 have channel regions (62, 64, and 66), which are offset from the channel regions (68, 70, and 72) of n-type devices 58. By way of example, channel region 62 is offset from channel region 68 by a distance 74 in the lateral direction. Although FIG. 3 shows three exemplary p-type and three exemplary n-type devices in portion 50 of the integrated circuit, the integrated circuit may include many types of such devices and other types of devices. Moreover, in the illustrated embodiment 76, 78, and 80 represent portions of the boundary between layer 52 and layer 54 which are closer to bank 58 than bank 56. Similarly 82, 84, and 86 represent portions of the boundary between layer 52 and layer 54 which are closer to bank 56 than bank 58. In order to optimize device performance, the distance from boundaries 76, 78, and 80 to bank 58 may be different than the distance from boundaries 82, 84, and 86 to bank 56. Similarly, the length of boundaries 76, 78, and 80 may be different from the length of boundaries 82, 84, and 86. Also, although layer 52 and layer 54 are shown as having a non-straight boundary, in another embodiment they may have a straight-line boundary. In this embodiment, the extent in the transverse direction to which the gate regions associated with 62, 64, 66, 68, 70, and 72 overlie the isolation region between bank 56 and bank 58 may be optimized, as the lift provided by the vertical height of such a gate region reduces the channel stress impact of overlying stress layers 52 or 54. For example, in a further embodiment, a straight line boundary between layer 52 and layer 54 may be placed nearer to p-type devices 56 than n-type devices 58, and the transverse extent to which gates associated with n-device channels 68, 70, and 72 overlie the isolation region between p-type devices 56 and n-type devices 58 may be greater than the transverse extent to which gates associated with p-device channels 62, 64, and 66 overlie the isolation region between p-type devices 56 and n-type devices 58.

Figure 4:
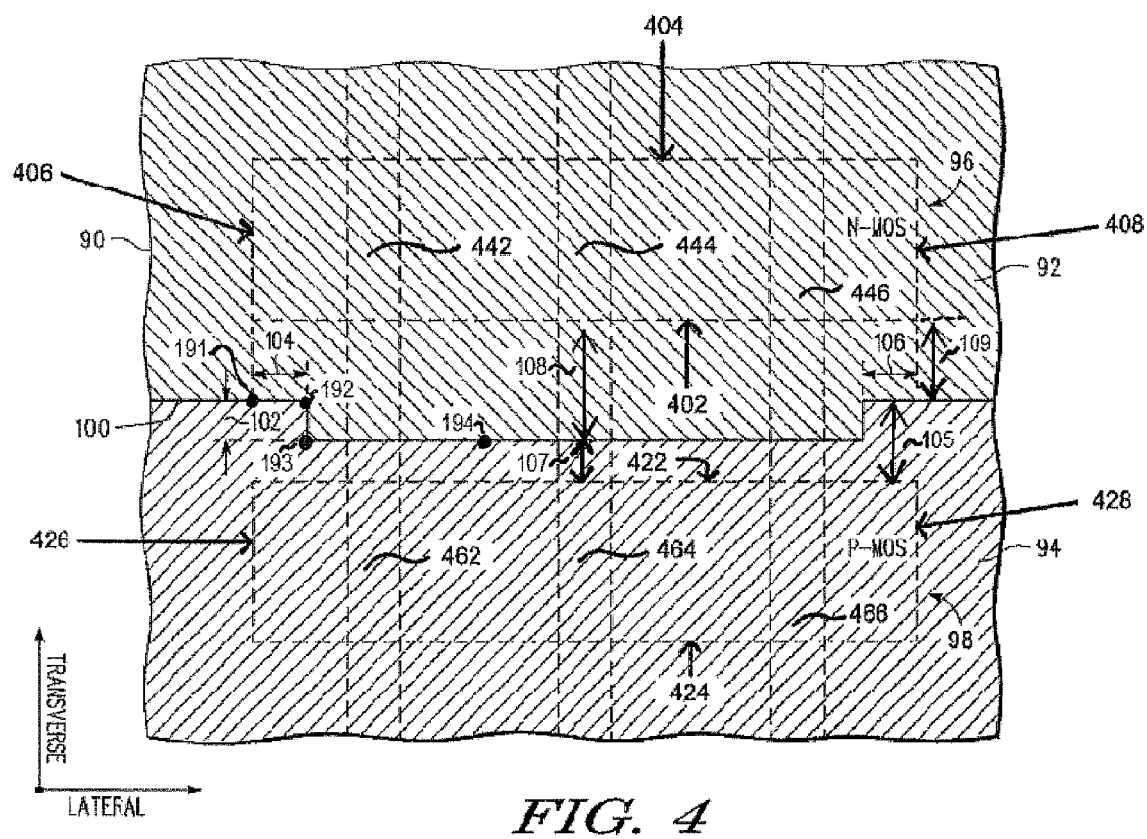
FIG. 4 is a view of a portion of an exemplary integrated circuit with a tensile region and a compressive region where the tensile region and the compressive region are offset with respect to the channel region in a lateral direction and a transverse direction, consistent with one embodiment of the invention.

FIG. 4 is a view of a portion 90 of an exemplary integrated circuit with a tensile region and a compressive region where the tensile region and the compressive region are offset with respect to the channel region in a lateral direction and a transverse direction, consistent with one embodiment of the invention. Portion 90 of the integrated circuit may include a layer 92, which may be tensile like layer 16 of FIG. 1. Portion 50 may further include a layer 94, which may be compressive like layer 14 of FIG. 1. N-type devices may be present in a N-MOS region 96 underlying layer 92. The N-MOS region 96 is an active region that has a pair of edges 402 and 404 extending in the lateral direction along opposite sides of the N-MOS region 96, and a pair of edges 406 and 408 extending in the transverse direction along opposite sides of the N-MOS region 96. Channel regions 442, 444, and 446 lie within the N-MOS region 96. P-type devices may be present in a P-MOS region 98 underlying layer 94. The P-MOS region 98 is an active region that has a pair of edges 422 and 424 extending in the lateral direction along opposite sides of the P-MOS region 98, and a pair of edges 426 and 428 extending in the transverse direction along opposite sides of the P-MOS region 98. Channel regions 462, 464, and 466 lie within the P-MOS region 98. A boundary 100 between layers 92 and 94 may be configured, such that layer 92 extends in a transverse direction away from an active region corresponding to n-type devices 96 for a distance 102 at a distance 104 from a transverse edge of the active region corresponding to n-type devices. Further, layer 92 may extend by a distance 102 at a distance 106 from another transverse edge of the active region corresponding to the n-type devices. Therefore, the layer 92 extends in a transverse direction away from the point where the edges 406 and 402 intersect by a distance 109, and extends away in a transverse direction from the edge 402 at a channel region of the N-MOS active region by a distance 108. Similarly, the layer 94 extends in a transverse direction away from the point where the edges 422 and 428 intersect by a distance 105, and extends away in a transverse direction from the edge 422 at channel region of the P-MOS channel region by a distance 108. The distances 104 and 106 may be the same or may be different to optimize the compressive and tensile stresses created by layers 94 and 92, respectively. In another embodiment, distance 102 may be negative, such that layer 92 extends in a transverse direction toward an active region corresponding to n-type devices. Also illustrated at FIG. 4 are points 191-194, where intermediate point 192 extends away from point 191 along boundary 100 in a lateral direction; intermediate point 193 extends away from point 192 along boundary 100 in a transverse direction; and intermediate point 194 extends away from point 193 along boundary 100 in lateral direction to a location that is nearer the middle channel region.

Figure 5:
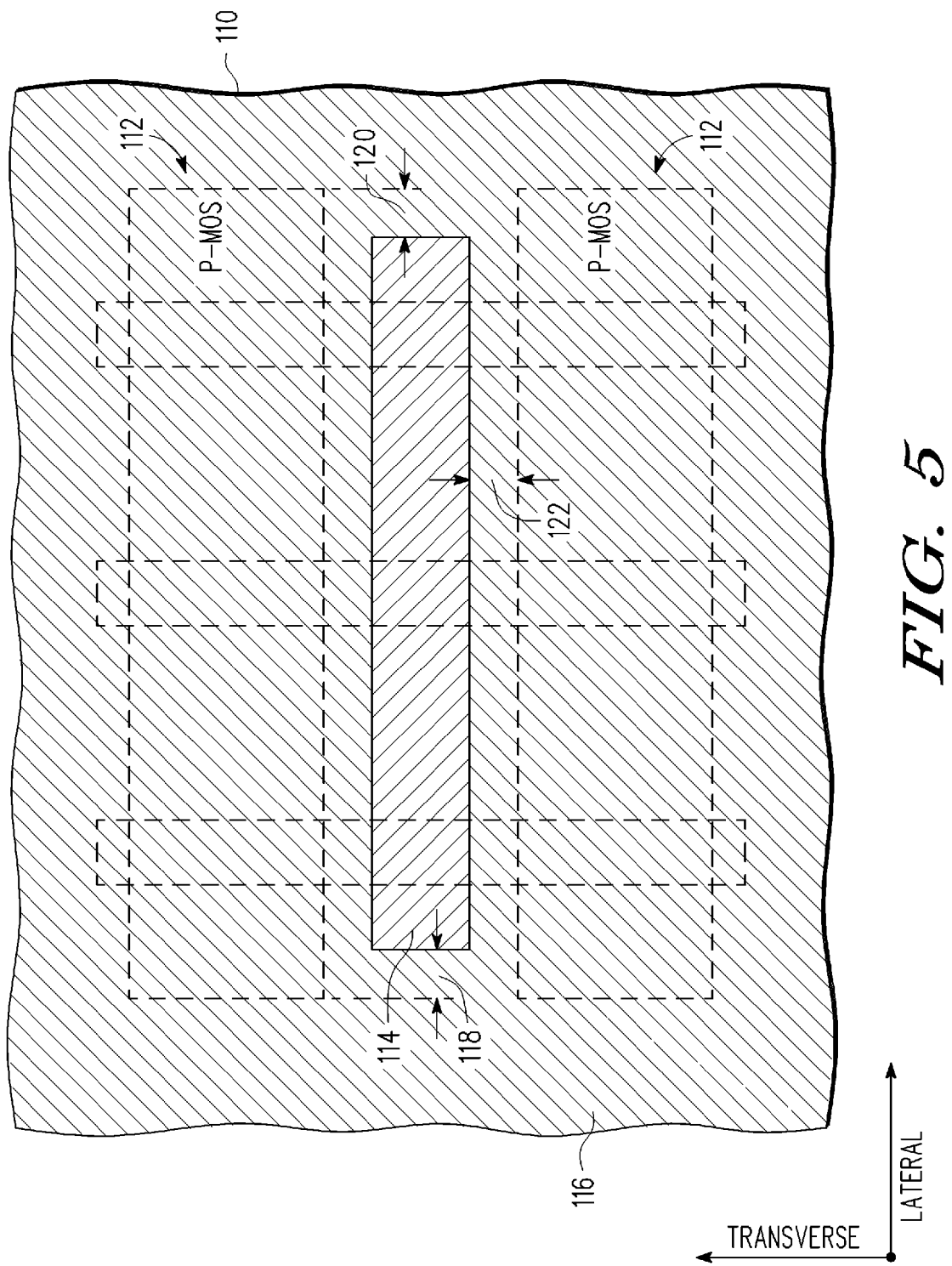
FIG. 5 is a view of a portion of an exemplary integrated circuit with a tensile region and a compressive region where the tensile region and the compressive region are offset with respect to the active region in a lateral direction and a transverse direction, consistent with one embodiment of the invention.

FIG. 5 is a view of a portion 110 of an exemplary integrated circuit with a tensile region and a compressive region where the tensile region and the compressive region are offset with respect to the active region in a lateral direction and a transverse direction, consistent with one embodiment of the invention. Portion 110 of the integrated circuit may include a layer 116, which may be compressive like layer 14 of FIG. 1. Portion 110 may further include a layer 114, which may be tensile like layer 16 of FIG. 1. P-type devices 112 may be formed as part of portion 110 of the integrated circuit. Gate regions corresponding to p-type devices may or may not extend below layer 114. A region occupied by layer 114 may be selected to optimize the compressive and tensile stresses created by layers 116 and 114. By way of example, a distance 118 of a transverse edge of layer 114 from a transverse edge of an active region corresponding to p-type devices 112 may be configured appropriately, and may be either positive or negative. Similarly, a distance 120 of the other transverse edge of layer 114 from the other transverse edge of the active region corresponding to the p-type devices 112 may be selected appropriately. Likewise, a distance 122 of a lateral edge of layer 114 from a lateral edge of the active region corresponding to p-type devices 112 may be selected appropriately. Distances 118, 120, and 122 may be optimized to equalize and maximize the stresses in the channels of p-type devices 112 induced by layers 114 and 116 such that all p-type devices operate at the same performance level. In particular, this optimization of stresses would result in better performance for the p-type devices located near the lateral edges of p-type devices bank 112.

Figure 6:
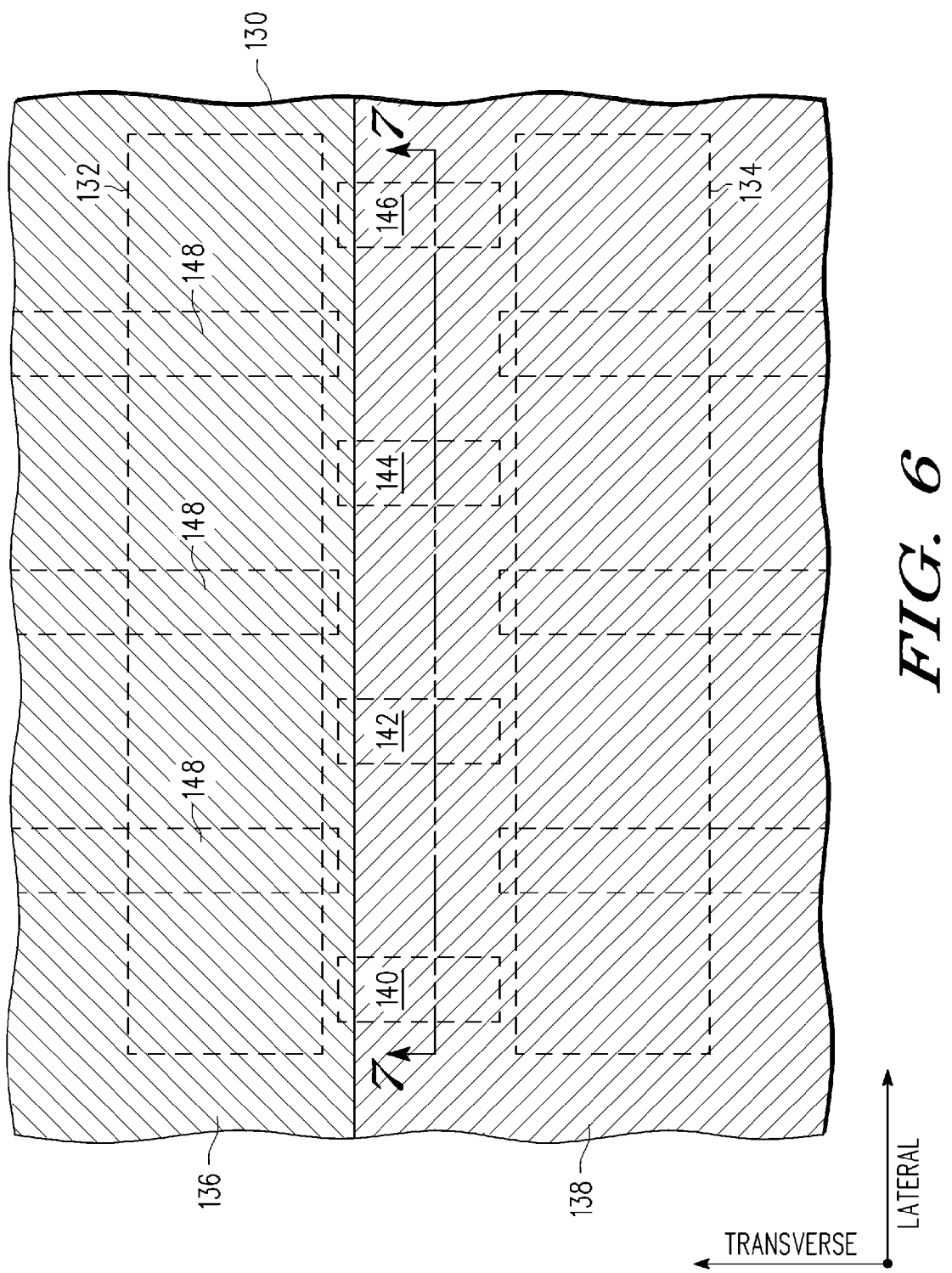
FIG. 6 is a view of a portion of an exemplary integrated circuit with a tensile region and a compressive region, consistent with one embodiment of the invention.

FIG. 6 is a view of a portion 130 of an exemplary integrated circuit with a tensile region and a compressive region, consistent with one embodiment of the invention. Portion 130 of the integrated circuit may include a layer 136, which may be compressive like layer 14 of FIG. 1. Portion 130 may further include a layer 138, which may be tensile like layer 16 of FIG. 1. P-type devices 132 may be formed as part of portion 130 of the integrated circuit. N-type devices 134 may be formed as part of portion 130 of the integrated circuit. Moreover, as shown in FIG. 6, dummy poly structures (or gate lines) 140, 142, 144, and 146 may be formed in the boundary region between a region occupied by p-type devices and a region occupied by the n-type devices. Dummy poly structures 140, 142, 144, and 146 may be formed under layer 138. The dummy poly structures 140, 142, 144, and 146 lift layer 138 away from the underlying isolation regions and minimize the degrading effect of layer 138 on the lateral channel stress of channel regions 148, as is described below. Dummy poly structures 140, 142, 144, and 146 may be offset from channel regions 148 of p-type devices by a selected distance.

Figure 7:
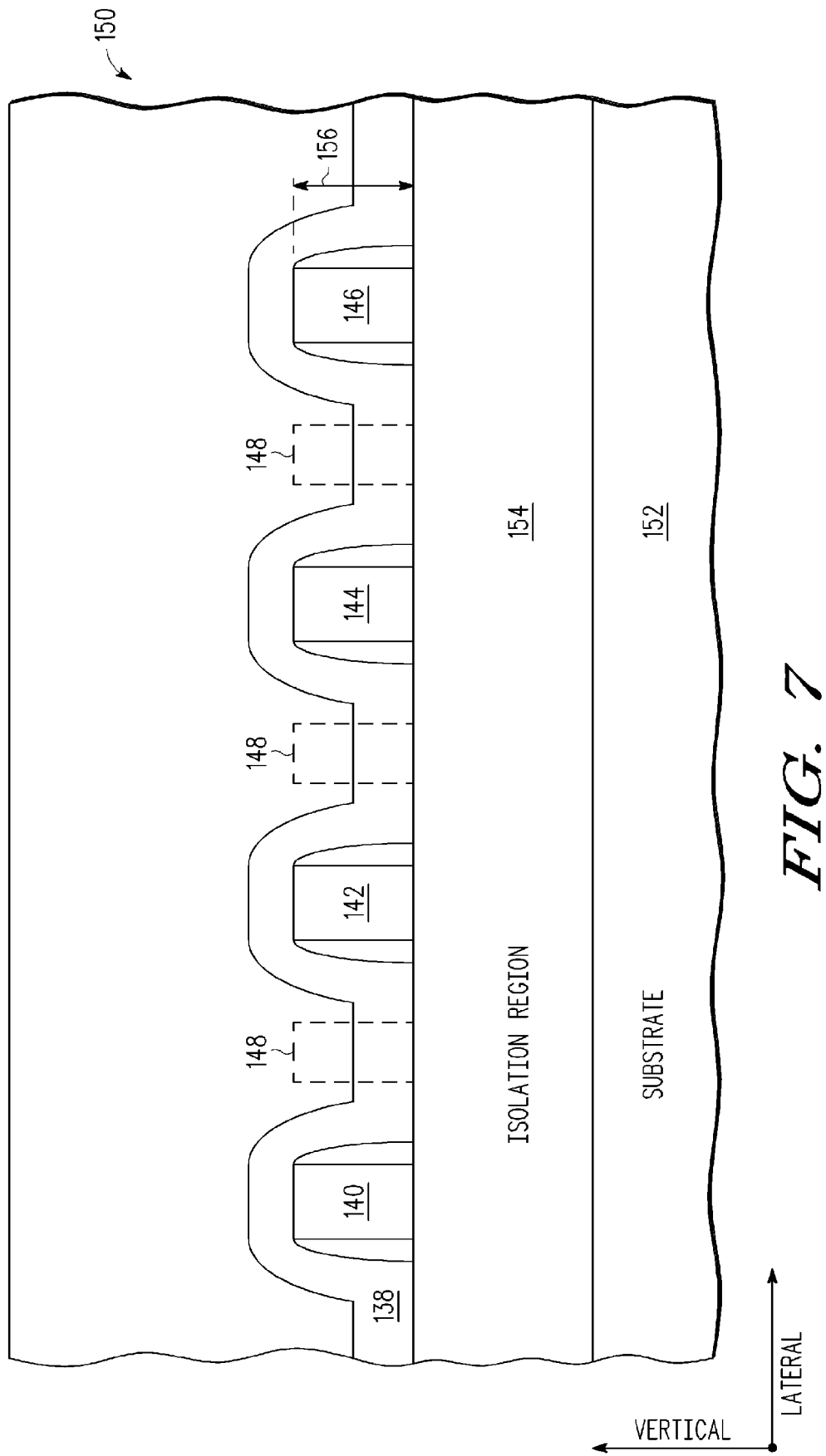
FIG. 7 is another view of the portion of the exemplary integrated circuit shown in FIG. 6, consistent with one embodiment of the invention.

FIG. 7 is a cross-section view 150 of the portion 130 of the exemplary integrated circuit shown in FIG. 6, consistent with one embodiment of the invention. In particular, for illustration purposes, FIG. 7 shows a cross-section view 150 of a portion of an integrated circuit, along direction 7-7, as labeled in FIG. 6. As shown in FIG. 7, the portion of integrated circuit may include a substrate 152 and an isolation region 154 formed over substrate 42. Substrate 152 can include a monocrystalline semiconductor wafer, a semiconductor-on-insulator wafer, a flat panel display (e.g., a silicon layer over a glass plate), or other substrate conventionally used to form semiconductor or electronic devices. Moreover, FIG. 7 shows a cross-section view of gate regions 148, which overlay channel regions corresponding to semiconductor devices formed as part of the integrated circuit. FIG. 7 further shows dummy poly structures 140, 142, 144, and 146. The presence of dummy poly structures 140, 142, 144, and 146 provides a lift to layer 138. In particular, layer 138 may be lifted by an offset of 156 because of the presence of dummy poly structures 140, 142, 144, and 146. Although FIG. 7 shows a particular arrangement and a particular number of dummy poly structures in a region occupied by layer 138, a different arrangement of a different number of dummy poly structures may be used, as well.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Although not described, conventional semiconductor processing techniques can be used to form the various layers, regions, and devices described above. Moreover, the integrated circuit portions containing the devices discussed above may be applied to all devices on the integrated circuit or to only a subset of the devices. In particular, tensile and compressive stress experienced by only the end devices may be modified in the manner described above.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
an active region including a first channel region, wherein:
the active region has a first edge abutting an isolation region, the first edge extending in a lateral direction and a second edge abutting the isolation region, the second edge extending in a transverse direction, wherein the second edge intersects the first edge;
the first channel region lies at the first edge and is spaced apart from the second edge; and
the first channel region extends in the transverse direction and the lateral direction;
a first layer overlying the active region, having a boundary, and having a first stress and a corresponding stress type; and
a second layer spaced apart from and not overlying the active region, and having a second stress that is less than the first stress or an opposite stress type from the corresponding stress type of the first stress,
wherein from a top view and along the boundary of the first layer, the first layer extends away a first distance in the transverse direction from the second edge of the active region and the first layer extends away a second distance in the transverse direction from the first edge at the first channel region, wherein the first distance is larger than the second distance.

2. The semiconductor device of claim 1 wherein the first stress is a compressive stress.

3. The semiconductor device of claim 1 wherein the second stress is a tensile stress.

4. The semiconductor device of claim 1 wherein the active region is a P-MOS region.

5. The semiconductor device of claim 1 wherein:
the active region further comprises a third edge abutting the isolation region, the third edge extending in the transverse direction that intersects the first edge; and
from the top view,
the first channel region is disposed between the second and third edges of the active region;
from a top view and along the boundary of the first layer, the first layer extends away a third distance in the transverse direction from the third edge of the active region, wherein the third distance is larger than the second distance.

6. The semiconductor device of claim 1 wherein the boundary extends:
a second distance in the lateral direction from a point along the boundary closest to the second edge, as measured in the transverse direction, to a first intermediate point farther from the second edge of the active region;
a third distance in the transverse direction from the first intermediate point to a second intermediate point;
in the lateral direction from the second intermediate point to another point along the boundary closer to the first channel region.

7. The semiconductor device of claim 1 wherein the first layer and the second layer are characterized as etch-stop layers.

8. The semiconductor device of claim 1 wherein the first layer is made of a silicon nitride material and the second layer is made of a silicon nitride material.

9. A semiconductor device comprising:
an active region including a first channel region, wherein:
the active region has a first edge abutting an isolation region, the first edge extending in a lateral direction and a second edge abutting the isolation region, the second edge extending in a transverse direction, wherein the second edge intersects the first edge;
the first channel region lies at the first edge and is spaced apart from the second edge; and
the first channel region extends in the transverse direction and the lateral direction;
a first layer spaced apart from and not overlying the active region, having a boundary, and having a first stress and a corresponding stress type; and
a second layer overlying the active region, and having a second stress that is less than the first stress or an opposite stress type from the corresponding stress type of the first stress,
wherein from a top view and along the boundary of the first layer, the first layer extends away a first distance in the transverse direction from the second edge of the active region and the first layer extends away a second distance in the transverse direction from the first edge at the first channel region, wherein the first distance is smaller than the second distance.

10. The semiconductor device of claim 9 wherein the first stress is a compressive stress, and the second stress is a tensile stress.

11. The semiconductor device of claim 10 wherein the active region is an N-MOS region.

12. The semiconductor device of claim 10 further comprising a P-MOS region spaced apart from the active region, wherein the first layer overlies the P-MOS region, and the second layer is spaced apart from and does not overlie the P-MOS region.

13. The semiconductor device of claim 12 wherein the P-MOS region includes a first channel region, wherein:
the P-MOS region has a first edge abutting an isolation region, the first edge extending in the lateral direction and a second edge abutting the isolation region, the second edge extending in the transverse direction, wherein the first edge of the P-MOS region intersects the second edge of the P-MOS region;

the first channel region of the P-MOS region lies at the first edge of the P-MOS region and is spaced apart from the second edge of the P-MOS region;

the first channel region of the P-MOS region extends in the transverse direction and the lateral direction;

wherein from the top view and along the boundary of the first layer, the first layer extends away a third distance in the transverse direction from the first edge of the P-MOS region at the first channel region of the P-MOS region and the first layer extends away a fourth distance in the transverse direction from the second edge of the P-MOS region, wherein the fourth distance is larger than the third distance.

14. The semiconductor device of claim 13 wherein:
the P-MOS region further includes a second channel region extending in the transverse and lateral directions: and
the second channel region of the P-MOS region is spaced apart in a lateral direction from the first channel region of the P-MOS region.

15. The semiconductor device of claim 14 wherein, in the transverse direction, the first and second channel regions of the P-MOS region are substantially a same distance from the boundary of the first layer.

16. The semiconductor device of claim 14 wherein:
the active region further includes a second channel region extending in the transverse and lateral directions: and
the second channel region of the active region is spaced apart in the lateral direction from the first channel region of the active region.

17. The semiconductor device of claim 16 wherein, in the transverse direction, the first and second channel regions of the active region are substantially a same distance from the boundary of the first layer.

18. The semiconductor device of claim 16 wherein, in the transverse direction, the first and second channel regions of the active region are substantially a same distance from the boundary of the first layer.

19. The semiconductor device of claim 9 wherein the first layer and the second layer are characterized as etch-stop layers.

20. The semiconductor device of claim 9 wherein the first layer is made of a silicon nitride material and the second layer is made of a silicon nitride material.

21. The semiconductor device of claim 9 wherein:
the active region further includes a second channel region extending in the transverse and lateral directions: and
the second channel region of the active region is spaced apart in the lateral direction from the first channel region of the active region.

22. The semiconductor device of claim 9 wherein the boundary extends:
a second distance in the lateral direction from a point along the boundary closest to the second edge, as measured in the transverse direction, to a first intermediate point farther from the second edge of the active region;
a third distance in the transverse direction from the first intermediate point to a second intermediate point;
in the lateral direction from the second intermediate point to another point along the boundary further from the second edge of the active region.

* * * * *